(12) United States Patent
Tanaka (10) Patent No.: US 8,493,549 B2
(45) Date of Patent: Jul. 23, 2013

(54) ILLUMINATION OPTICAL APPARATUS, EXPOSURE APPARATUS, AND DEVICE MANUFACTURING METHOD

(75) Inventor: Hirohisa Tanaka, Kumagaya (JP)

(73) Assignee: Nikon Corporation, Tokyo (JP)

( * ) Notice: Subject to any disclaimer, the term of this patent is extended or adjusted under 35 U.S.C. 154(b) by 826 days.

(21) Appl. No.: 12/230,394

(22) Filed: Aug. 28, 2008

(65) Prior Publication Data

US 2009/0002671 A1    Jan. 1, 2009

Related U.S. Application Data

(63) Continuation of application No. PCT/JP2007/055237, filed on Mar. 15, 2007.

(30) Foreign Application Priority Data

Mar. 27, 2006 (JP) .................................. 2006-086322

(51) Int. Cl.
*G03B 27/54* (2006.01)
*G03B 27/42* (2006.01)

(52) U.S. Cl.
USPC .............................................. 355/67; 355/53

(58) Field of Classification Search
USPC .... 355/52, 53, 55, 67; 250/548; 356/399–401
See application file for complete search history.

(56) References Cited

U.S. PATENT DOCUMENTS

| 5,867,319 A | 2/1999 | Sugiyama et al. | |
|---|---|---|---|
| 6,078,380 A * | 6/2000 | Taniguchi et al. | 355/52 |
| 6,285,443 B1 | 9/2001 | Wangler et al. | |
| 6,597,430 B1 * | 7/2003 | Nishi et al. | 355/53 |
| 6,864,959 B2 * | 3/2005 | Shiraishi et al. | 355/67 |
| 6,885,433 B2 * | 4/2005 | Shiraishi | 355/67 |
| 7,102,731 B2 * | 9/2006 | Hirukawa et al. | 355/55 |
| 2002/0054283 A1 | 5/2002 | Kato et al. | |
| 2002/0080338 A1 * | 6/2002 | Taniguchi | 355/67 |
| 2003/0025890 A1 * | 2/2003 | Nishinaga | 355/53 |
| 2004/0174512 A1 | 9/2004 | Toyoda et al. | |
| 2004/0263817 A1 * | 12/2004 | Tanitsu et al. | 355/67 |
| 2005/0179881 A1 | 8/2005 | Kohno | |
| 2007/0165202 A1 | 7/2007 | Koehler et al. | |
| 2008/0074632 A1 * | 3/2008 | Tanitsu et al. | 355/71 |

FOREIGN PATENT DOCUMENTS

| JP | 8-328261 | 12/1996 |
|---|---|---|
| JP | 11-274070 | 10/1999 |
| JP | 2001-324687 | 11/2001 |
| JP | 2001-337462 | 12/2001 |
| JP | 2002-15987 | 1/2002 |

(Continued)

OTHER PUBLICATIONS

International Search Report mailed May 15, 2007 in connection with the International Application No. PCT/JP2007/055237.

(Continued)

*Primary Examiner* — Hung Henry Nguyen (57) ABSTRACT

An illumination optical apparatus that substantially maintains a desirable profile even when changing the outer shape of light intensity distribution formed on an illumination pupil plane with an axicon system. The illumination optical system illuminates an irradiated surface based on light from an optical source and includes a prism system, which changes the interval along an optical axis between a pair of prisms to change the light intensity distribution on an illumination pupil plane.

8 Claims, 6 Drawing Sheets

FOREIGN PATENT DOCUMENTS

| | | |
|---|---|---|
| JP | 2002-231619 | 8/2002 |
| JP | 2003-68604 | 3/2003 |
| JP | 2004-57742 | 2/2004 |
| JP | 2005-228846 | 8/2005 |
| WO | 2005/026843 A2 | 3/2005 |

OTHER PUBLICATIONS

Chinese Office Action issued Mar. 10, 2011 in corresponding Chinese Patent Application 200780010452.6.

Supplementary European Search Report, dated Sep. 6, 2010.

PCT Search Report issued on Oct. 30, 2008 in corresponding International Application PCT/JP2007/055237.

Japanese Office Action mailed Apr. 12, 2012 issued in corresponding Japanese Patent Application No. 2008-507429.

Japanese Notification of Reasons for Rejection mailed Jan. 15, 2013, issued in corresponding Japanese Patent Application No. 2008-507429.

* cited by examiner

ILLUMINATION OPTICAL APPARATUS, EXPOSURE APPARATUS, AND DEVICE MANUFACTURING METHOD

CROSS-REFERENCE TO RELATED APPLICATIONS

This application is based upon and claims the benefit of priorities from International Application No. PCT/JP2007/055237 filed on Mar. 15, 2007, and Japanese Patent Application No. 2006-086322 filed on Mar. 27, 2006, the entire contents of which are incorporated herein by reference.

BACKGROUND OF THE INVENTION

The present invention relates to an illumination optical apparatus, an exposure apparatus, and a device manufacturing method, and more particularly, to an illumination optical apparatus suitable for use as an exposure apparatus that manufactures devices such as semiconductor device and a liquid crystal display device in a lithography process.

In this type of typical exposure apparatus, light emitted from a light source passes through a fly's eye lens (or microlens array), which serves as an optical integrator, and forms a secondary light source, which serves as a substantial planar light source formed by many light sources. Light from the secondary light source, which is converged by a condenser lens, illuminates in a superimposed manner a mask including a predetermined pattern.

The light transmitted through the pattern of the mask passes through a projection optical system and forms an image on a wafer. In this manner, the mask pattern is projected and exposed (transferred) onto the wafer. The pattern formed on the mask is highly integrated. Thus, the illumination distribution on the wafer must be uniform to accurately transfer the fine pattern onto the wafer.

In the prior art, a technique in which a circular secondary light source is formed at a rear focal plane of a fly's eye lens, and the size of the secondary light source is varied to change the illumination coherency σ (σ value=emission side numerical aperture of illumination optical system/incidence side numerical aperture of projection optical system) has been attracting attention. Further, a modified illumination technique of forming a annular-shaped or quadrupole secondary light source on the rear focal plane of the fly's eye lens to enhance the depth of focus and resolving power of a projection optical system described in Japanese Laid-Open Patent Publication No. 2002-231619 and corresponding U.S. Patent Publication No. 2004/0263817A1.

In the modified illumination technique, for example, for annular illumination, a conical axicon system including two prism members is used to change the outer shape (annular ratio etc.) of the annular illumination field (annular light intensity distribution), which is formed at an incidence plane (illumination pupil plane) of the fly's eye lens. This changes the outer shape of the annular-shaped secondary light source formed at or near the rear focal plane of the fly's eye lens. In recent exposure apparatuses, it is desired that exposure be performed in a high σ state in which the σ value is approximated to 1 in, for example, annular illumination.

However, if the two prism members in the conical axicon system is spaced apart from each other in annular illumination, the profile (cross-sectional shape) of the annular light intensity distribution on an illumination pupil plane (and ultimately, the pupil plane of the projection optical system) will be shaped with a distorted periphery. Such a shaped would differ from the ideal top-hat shape. In such a case, in the annular light intensity distribution at the pupil plane of the projection optical system, the light at the peripheral portion would not pass through an aperture of the pupil plane of the projection optical system. Such light would be shielded and become stray light thereby lowering the imaging capability of the projection optical system.

SUMMARY OF THE INVENTION

An embodiment of the present invention to provide an illumination optical apparatus that enables the desired profile to be maintained even when changing the outer shape of the light intensity distribution at the illumination pupil plane when using an axicon system. Another embodiment of the present invention is to provide an exposure apparatus capable of performing satisfactory exposure under proper illumination conditions using an illumination optical apparatus that changes the outer shape of the light intensity distribution formed at the illumination pupil plane while maintaining a substantially desired profile.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessary achieving other advantages as may be taught or suggested herein.

One embodiment of the present invention is an illumination optical apparatus for illuminating an irradiated plane based on a light from a light source. The illumination optical apparatus includes a prism system including a pair of prisms in which the prism system changes an interval along an optical axis between the pair of prisms to change light intensity distribution on an illumination pupil plane. One or more movable lenses arranged in an optical path between the prism system and the irradiated plane, wherein the one or more movable lenses are movable along a direction of the optical axis in accordance with a change in the interval along the optical axis between the a pair of prisms.

A second embodiment of the present invention is an illumination optical apparatus for illuminating an irradiated plane based on light from a light source. The illumination optical apparatus includes an adjustment system arranged in an optical path between the light source and the irradiated plane. The adjustment system adjusts inclination of a principal ray reaching the irradiated plane relative to an optical axis. One or more movable lenses are movable along a direction of the optical axis to shape the form of a light intensity distribution on an illumination pupil plane in accordance with the adjustment of the adjustment system.

A third embodiment of the present invention is an illumination optical apparatus for use in an exposure apparatus for exposing a predetermined pattern onto a substrate with a projection optical system. The illumination optical apparatus includes an optical system which changes light intensity distribution on an illumination pupil. A shaping member shapes the light intensity distribution on the illumination pupil formed by the optical system so as not to exceed the size of an aperture for an aperture stop in the projection optical system.

A fourth embodiment of the present invention is an illumination optical apparatus for use in an exposure apparatus for exposing a predetermined pattern onto a substrate. The illumination optical apparatus includes an optical system which changes light intensity distribution on an illumination pupil.

A correction member corrects blurring of the light intensity distribution on the illumination pupil formed by the optical system.

A fifth embodiment of the present invention is an illumination optical apparatus for use in an exposure apparatus for exposing a predetermined pattern onto a substrate with a projection optical system. The illumination optical apparatus includes an adjustment optical system which adjusts inclination of a principal ray on the substrate. A shaping member shapes the light intensity distribution at an illumination pupil in accordance with the adjustment of the adjustment optical system so as not to exceed the size of an aperture for an aperture stop in the projection optical system.

A sixth embodiment of the present invention is an exposure apparatus including the illumination optical apparatus of the first, second, third, fourth, or fifth embodiment which illuminates and exposes a predetermined pattern onto a photosensitive substrate.

A seventh embodiment of the present invention is a device manufacturing method including exposing the predetermined pattern onto the photosensitive substrate using the exposure apparatus of the sixth embodiment, developing the photosensitive substrate onto which the pattern has been transferred, forming a mask layer shaped in correspondence with the pattern on the photosensitive substrate, and processing the surface of the photosensitive substrate through the mask layer.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

FIG. 4(*a*) shows a state in which an annular light intensity distribution having a substantially desired profile is formed at a pupil plane of the projection optical system in correspondence with a contact state of the conical axicon system, and FIG. 4(*b*) shows a state in which the annular light intensity distribution having a profile with a distorted periphery is formed at a pupil plane of the projection optical system in correspondence with the spaced state of the conical axicon system;

DETAILED DESCRIPTION OF THE PREFERRED EMBODIMENTS

Figure 1:
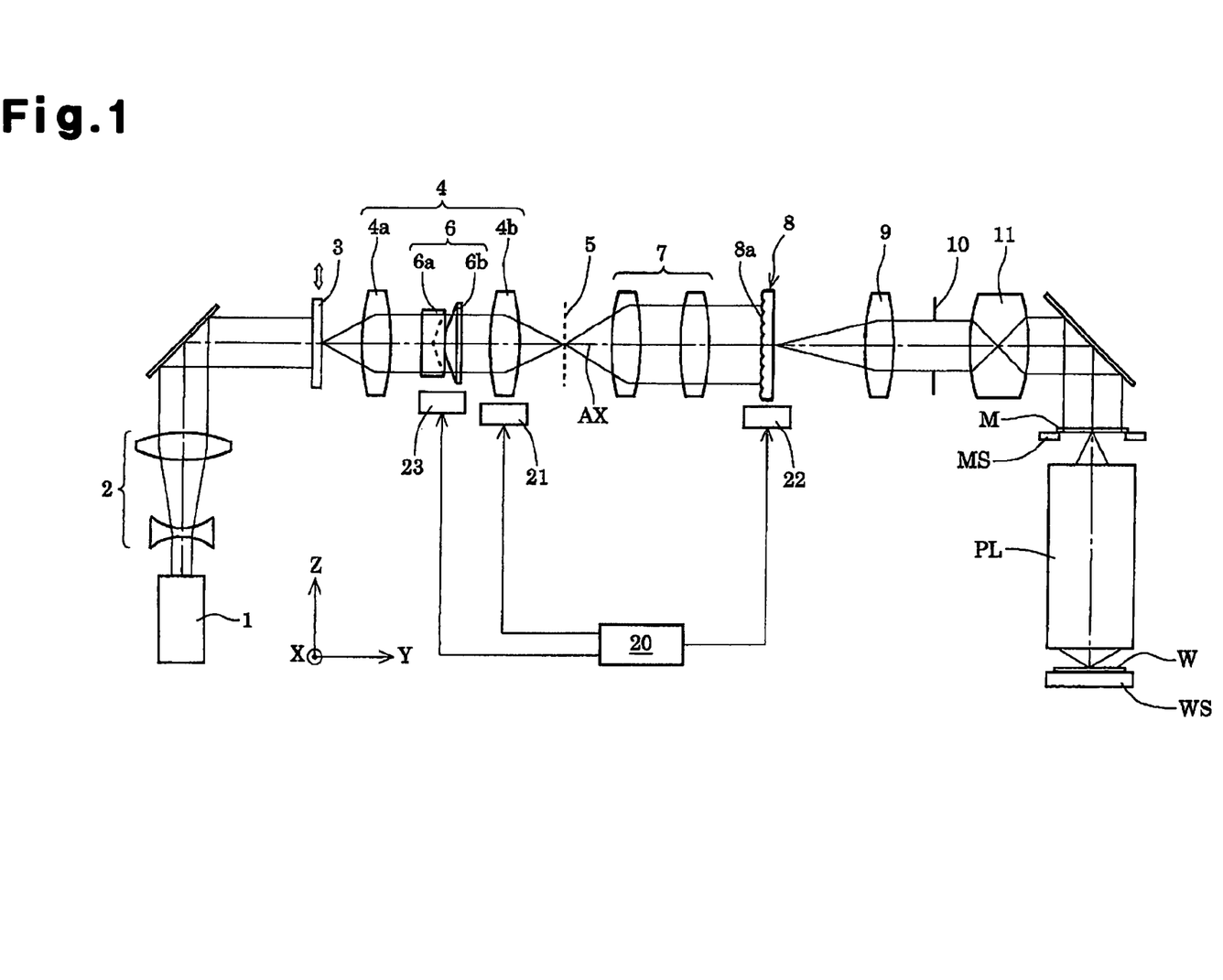
FIG. 1 is a schematic diagram showing the structure of an exposure apparatus according to one embodiment of the present invention.

One embodiment of the present invention will now be discussed with reference to the accompanying drawings. FIG. 1 is a schematic diagram showing the structure of an exposure apparatus according to one embodiment of the present invention. In FIG. 1, the Z axis is set along a normal direction of a wafer W, which is a photosensitive substrate, the Y axis is set in a direction parallel to the plane of FIG. 1 in the plane of the wafer W, and the X axis is set in a direction perpendicular to the plane of FIG. 1 in the plane of the wafer W.

With reference to FIG. 1, the exposure apparatus of the present embodiment includes a light source 1 for supplying exposure light (illumination light). An ArF excimer laser light source for supplying light of wavelength 193 nm, a KrF excimer laser light source for supplying light of wavelength 248 nm, and the like may be used as the light source 1. A shaping optical system 2 enlarges the light emitted from the light source 1 to light having a desired cross-sectional shape and then enters an afocal optical system 4 through an annular illumination diffractive optical element 3.

The afocal optical system 4 is an afocal optical system set such that a front focal position of a front lens group 4a substantially coincides with the position of the diffractive optical element 3, and a rear focal position of a rear lens group 4b substantially coincide with the position of a predetermined plane 5 shown by broken lines in the drawings. As will be described later, the rear lens group 4b in the afocal optical system 4 is configured to be integrally movable along an optical axis AX. A drive unit 21, which is operated based on a command from a control unit 20, integrally moves the rear lens group 4b along the optical axis direction. Generally, a diffractive optical element is configured by forming steps at a pitch of about the wavelength of the exposure light (illumination light) on a substrate. Further, the diffractive optical elements serves to diffract an incident beam at a desired angle.

Specifically, the annular illumination diffractive optical element 3 functions to form an annular light intensity distribution in a far field (or Fraunhofer diffraction region) upon entry of parallel light beams having a rectangular cross-section. Accordingly, the substantially parallel light beams entering the diffractive optical element 3 forms an annular light intensity distribution on the pupil plane of the afocal optical system 4 and is then emitted from the afocal optical system 4 with an annular angular distribution. A conical axicon system 6 is arranged on or near the pupil plane of the afocal optical system 4 in an optical path between the front lens group 4a and the rear lens group 4b. The structure and operation of the conical axicon system 6 will now be discussed.

The light passing through the afocal optical system 4 enters a micro-fly's eye lens (or fly's eye lens) 8 through a zoom lens (variable magnification optical system) 7, which varies the σ value (σ value=mask side numerical aperture of illumination optical apparatus/mask side numerical aperture of projection optical system). The micro-fly's eye lens 8 is an optical element including many micro lenses having a positive refracting power and finely arranged in horizontal and vertical directions. The micro-fly's eye lens 8 is formed to be movable along the optical axis AX if necessary. A drive unit 22, which is operated based on a command from the control unit 20, moves the micro-fly's eye lens 8 in the optical axis direction.

Generally, a micro-fly's eye lens is, for example, obtained by etching a parallel plane plate and forming a group of micro lenses. Each micro lens in the micro-fly's eye lens is smaller than each lens element forming a fly's eye lens. The micro-fly's eye lens differs from a fly's eye lens, which is formed by isolated lens elements, in that many micro lenses (micro refraction surfaces) are integrally formed without being isolated from one another. However, the micro-fly's eye lens is the same as the fly's eye lens in that it is an optical integrator of a wavefront splitting type in which lens elements having a positive refracting power are arranged horizontally and vertically.

The predetermined plane 5 is located near the front focal position of the zoom lens 7, and the incidence plane of the micro-fly's eye lens 8 is located near the rear focal position of the zoom lens 7. In other words, the zoom lens 7 is arranged so that the predetermined plane 5 and the incidence plane of the micro-fly's eye lens 8 is in a substantial Fourier transformation relationship and so that the pupil plane of the afocal optical system 4 is substantially optically conjugated with the incidence plane of the micro-fly's eye lens 8.

Accordingly, in the same manner as the pupil plane of the afocal optical system 4, for example, an annular illumination field (annular light intensity distribution) of which the center is the optical axis AX is formed at the incidence plane (irradiation pupil plane) of the micro-fly's eye lens 8. The entire shape of the annular illumination field varies with similarity in accordance with the focal distance of the zoom lens 7. Each micro lens of the micro-fly's eye lens 8 has a rectangular cross-section having similarity with the shape of the illumination field formed on the mask M (and ultimately the shape of the exposure region that is to be formed on the wafer W).

The light entering the micro-fly's eye lens 8 is split two-dimensionally by many micro lenses. This forms a secondary light source on or near the rear focal plane, with the secondary light source having a light intensity distribution that is substantially the same as the illumination field formed by the incident light, namely, the secondary light source including the substantially annular-shaped planar light source of which the center is the optical axis AX. The light from the secondary light formed on or near the rear focal plane of the micro-fly's eye lens 8 illuminates a mask blind 10 in a superimposed manner after passing through a condenser optical system 9.

In this manner, a rectangular illumination field corresponding to the shape and focal distance of each micro lens in the micro-fly's eye lens 8 is formed in the mask blind 10 serving as an illumination field stop. The light passed through a rectangular aperture (light transmitting part) of the mask blind 10 illuminates in a superimposing manner the mask M, which includes a predetermined pattern, after undergoing the converging action of an imaging optical system 11. That is, the imaging optical system 11 forms the image of the rectangular aperture of the mask blind 10 on the mask M.

The light transmitted through the pattern of the mask M, which is held on a mask stage MS, passes through a projection optical system PL and forms an image of the mask pattern on the wafer (photosensitive substrate) W, which is held on a wafer stage WS. The pattern of the mask M is sequentially exposed on each exposure region of the wafer W by performing batch exposure or scan exposure while driving and controlling in a two-dimensional manner the wafer stage WS, and ultimately, the wafer W along a plane (XY plane) orthogonal to the optical axis AX of the projection optical system PL.

The conical axicon system 6 includes from the light source side a first prism member 6a, which has a planar surface facing toward the light source side and a concave conical refraction surface facing toward the mask side, and a second prism member 6b, which has a planar surface facing toward the mask side and a convex conical refraction surface facing toward the light source side. The concave conical refraction surface of the first prism member 6a and the convex conical refraction surface of the second prism member 6b are formed in a complementary manner so that they come into contact with each other. At least either one of the first prism member 6a and the second prism member 6b is movable along the optical axis AX so that the interval between the concave conical refraction surface of the first prism member 6a and the convex conical refraction surface of the second prism member 6b is variable. A drive unit 23, which is operated based on a command from the control unit 20, changes the interval along the optical axis AX between the first prism member 6a and the second prism member 6b of the conical axicon system 6.

The operation of the conical axicon system 6 and the operation of the zoom lens 7 will be described in relation with the annular-shaped secondary light source. In a state in which the concave conical refraction surface of the first prism member 6a and the convex conical refraction surface of the second prism member 6b are in contact with each other, the conical axicon system 6 functions as a parallel plane plate and does not affect the annular-shaped secondary light source that is to be formed. However, when spacing the concave conical refraction surface of the first prism member 6a and the convex conical refraction surface of the second prism member 6b, the outer diameter (inner diameter) of the annular-shaped secondary light source changes while the width of the annular-shaped secondary light source (one half the difference of the outer diameter and the inner diameter of the annular-shaped secondary light source) remains constant. That is, the annular ratio (inner diameter/outer diameter) and the size (outer diameter) of the annular-shaped secondary light source change.

The zoom lens 7 functions to enlarge or reduce the entire shape of the annular-shaped secondary light source with similarity. For example, the entire shape of the annular-shaped secondary light source is enlarged with similarity by enlarging the focal distance of the zoom lens 7 from a minimum value to a predetermined value. In other words, the zoom lens 7 changes both the width and size (outer diameter) without changing the annular ratio of the annular-shaped secondary light source. The annular ratio and the size (outer diameter) of the annular-shaped secondary light source can thus be controlled by the conical axicon system 6 and the zoom lens 7.

Figure 2:
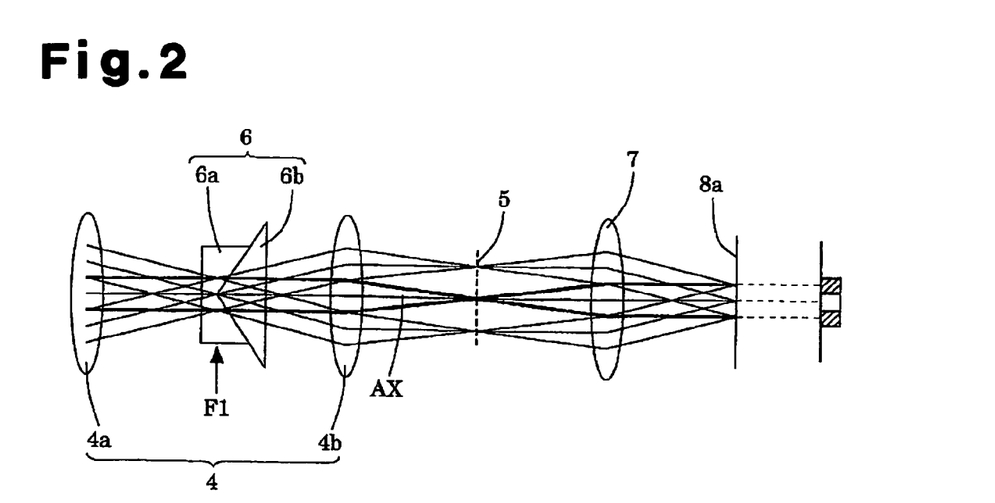
FIG. 2 is a diagram illustrating a light intensity distribution obtained at an illumination pupil plane in a contact state of a conical axicon system.

As described above, the conical axicon system 6 functions as a parallel plane plate in the state shown in FIG. 2, that is, in a contact state in which the concave conical refraction surface of the first prism member 6a and the convex conical refraction surface of the second prism member 6b are in contact with each other. When the conical axicon system 6 is in the contact state, the pupil position (position indicated by the arrow F1 in the drawing) in the composite system of the conical axicon system 6 and the afocal optical system 4 is optically conjugated with the incidence surface (illumination pupil plane) 8a of the micro-fly's eye lens 8. Further, as schematically shown at the right end of the drawing, an annular light intensity distribution having the substantially desired profile (cross-sectional shape) that is close to a top-hat shape is formed on the illumination pupil plane 8a. In other words, the two ends for the cross-sectional shape of the light intensity distribution is substantially vertical at the illumination pupil plane 8a.

Figure 3:
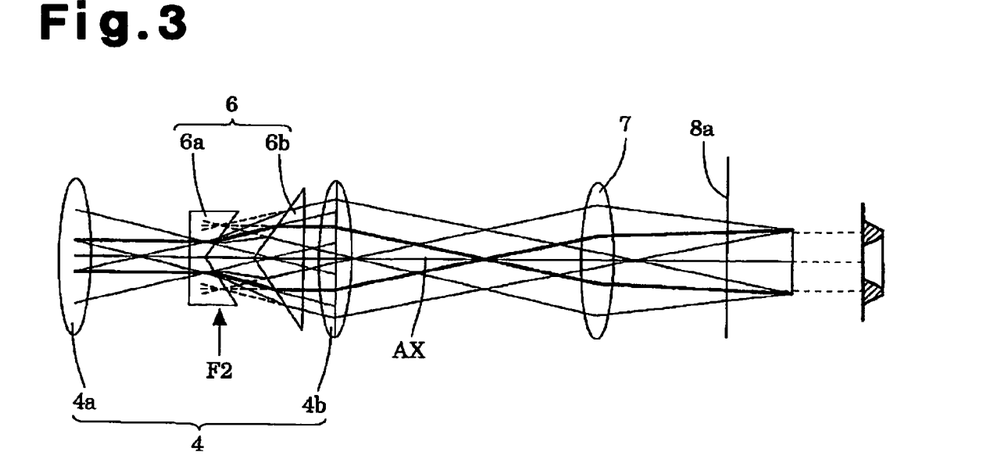
FIG. 3 is a diagram illustrating a light intensity distribution obtained at the illumination pupil plane in a spaced state of the conical axicon system.

Referring to FIG. 3, in a spaced state in which the concave conical refraction surface of the first prism member 6a is spaced from the convex conical refraction surface of the second prism member 6b, the optical path length in the conical axicon system 6 changes from that of the contact state. That is, in the spaced state of the conical axicon system 6, the conjugated relationship of the pupil position (position indicated by the arrow F2 in the drawing) in the composite system of the conical axicon system 6 and the afocal optical system 4 with the incidence surface 8a of the micro-fly's eye lens 8 is no longer established. Further, as schematically shown at the right end of the drawings, the annular light intensity distribution having a profile with a distorted periphery and thereby differing from the top-hat shape is formed in the illumination pupil plane 8a. In other words, the pupil image (light intensity distribution) formed on the incidence surface 8a (illumination pupil plane) of the micro-fly's eye lens 8 is defocused and blurred. As a result, an annular light intensity distribution having a profile with a distorted periphery is formed on the incidence surface 8a.

Figure 4A:
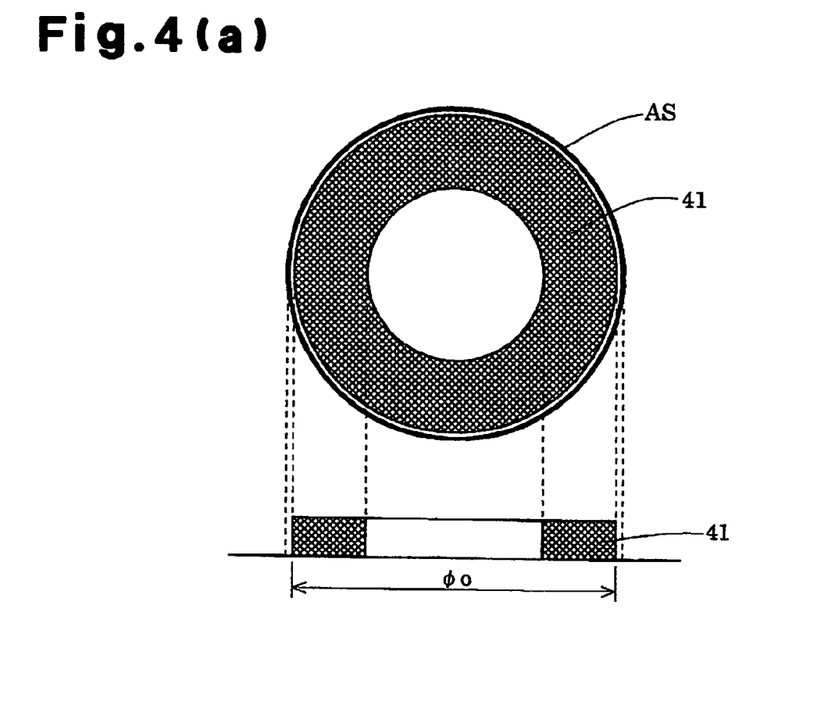

Thus, in the contact state of the conical axicon system 6, an annular light intensity distribution 41 having the substantially desired profile, which is close to the top-hat shape, is formed at the pupil plane of the projection optical system PL, as schematically shown in FIG. 4(a). In this case, the light in the annular light intensity distribution 41 formed at the pupil plane of the projection optical system PL is not shielded by an aperture AS in the pupil plane of the projection optical system PL (aperture of aperture stop arranged at the pupil plane of the projection optical system PL) even when set to a high σ state in which the σ value is approximated to 1. If the profile of the annular light intensity distribution 41 has a top-hat shape, the σ value is defined based on the outer diameter φo of the annular light intensity distribution 41.

Figure 4B:
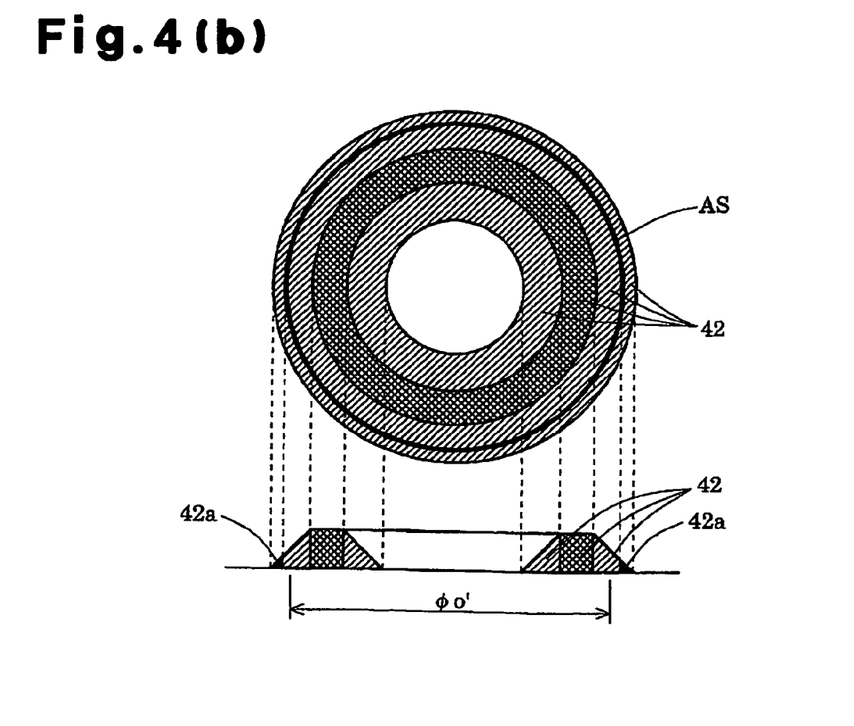

Comparatively, as schematically shown in FIG. 4(b), when the conical axicon system 6 is in the spaced state, an annular light intensity distribution 42 having a distorted periphery is formed on the pupil plane of the projection optical system PL. In this case, when set in a high σ state in which the σ value is approximated to 1, the light at a peripheral portion 42a (black portion in the drawing) of the annular light intensity distribution 42 formed on the pupil plane of the projection optical system PL is shielded without passing through the aperture AS of the pupil plane of the projection optical system PL (aperture of aperture stop arranged at the pupil plane of the projection optical system PL) and becomes stray light. This may lower the focusing capability of the projection optical system PL. Since the profile of the annular light intensity distribution 42 is shaped with a distorted periphery, the C value is determined based on the effective outer diameter φo' of the annular light intensity distribution 42.

Figure 5:
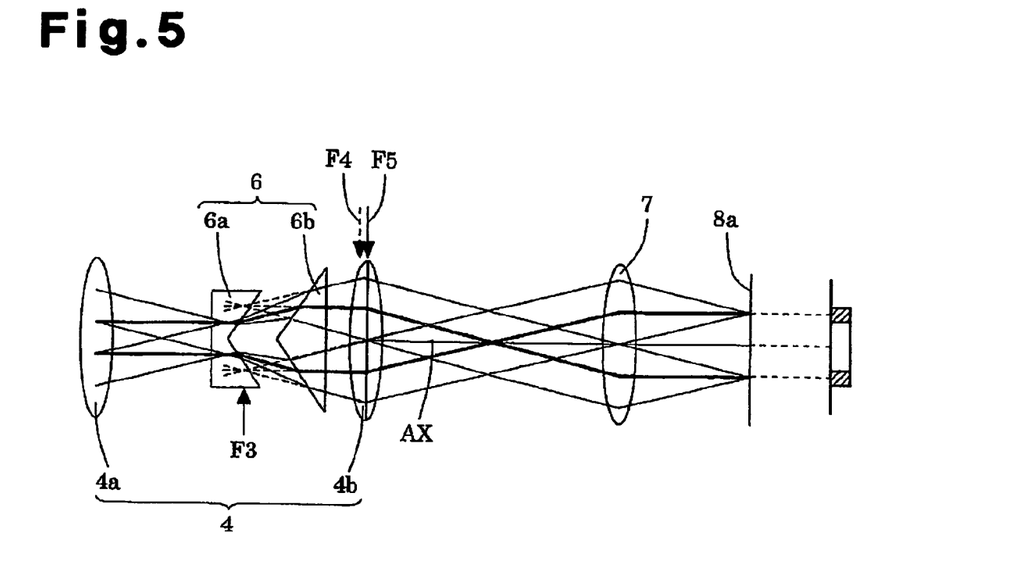
FIG. 5 is a diagram illustrating a state for shaping the profile of a light intensity distribution formed at the illumination pupil plane by moving a rear lens group in an afocal optical system in accordance with the operation of the conical axicon system.

In this embodiment, as shown in FIG. 5, the rear lens group 4b in the afocal optical system 4 is integrally moved along the optical axis AX in accordance with changes in the interval along the optical axis AX between the first prism member 6a and the second prism member 6b when separating the concave conical refraction surface of the first prism member 6a and the convex conical refraction surface of the second prism 6b and changing the outer shape of the annular light intensity distribution formed at the illumination pupil plane 8a. Specifically, the rear lens group 4b is moved from its original position as indicated in the drawing by the arrow F4 to a position indicated by the arrow F5 along the optical axis AX so as to maintain the conjugated relationship between the pupil position (position indicated by the arrow F3 in the drawing) of the composite system of the conical axicon system 6 and the afocal optical system 4 and the incidence surface 8a of the micro-fly's eye lens 8. That is, movement of the rear lens group 4b to the position indicated by the arrow F5 in the drawing forms a focused pupil image (light intensity distribution) on the incidence plane 8a (illumination pupil plane) of the micro-fly's eye lens 8. As a result, an annular light intensity distribution close to a top-hat shape is formed.

In this manner, the profile for the light intensity distribution on the illumination pupil plane 8a is shaped by the movement of the rear lens group 4b in the optical axis direction. Further, as schematically shown at the right end in FIG. 5, in the same manner as in the contact state of the conical axicon system 6, when in the spaced state, an annular light intensity distribution having a substantially desired profile that is close to the top-hat shape is formed on the illumination pupil plane 8a. As a result, as schematically shown in FIG. 4(a), an annular light intensity distribution having a substantially desired profile that is close to the top-hat shape is formed at the pupil plane of the projection optical system PL. Thus, light in the annular light intensity distribution will not be shielded by the aperture AS of the pupil plane of the projection optical system PL (aperture of aperture stop arranged at the pupil plane of the projection optical system PL) even when set to a high σ state in which the σ value is approximated to 1. In this manner, since movement of the rear lens group 4b substantially shapes the two ends of the cross-sectional of the light intensity distribution to be vertical at the illumination pupil plane 8a, stray light can be prevented.

As described above, in the illumination optical apparatus (1 to 11) of this embodiment, the shaping member for shaping the light intensity distribution at the illumination pupil such as the rear lens group 4b (or correction member for correcting the blur of the light intensity distribution at the illumination pupil) maintains the profile of the annular light intensity distribution to have a substantially desired shape even when the conical axicon system 6 changes the outer shape of the annular light intensity distribution formed on the illumination pupil plane 8a. In the exposure apparatus (1 to PL) of this embodiment, satisfactory projection and exposure can be performed under proper illumination conditions using the illumination optical apparatus (1 to 11) that changes the outer shape of the light intensity distribution formed at the illumination pupil plane 8a while maintaining the substantially desired profile.

In this embodiment, it is difficult to accurately transfer the pattern of the mask M onto the wafer W if the image side telecentricity of the projection optical system PL is not satisfactory and the principal ray reaching the wafer W is inclined relative to the optical axis AX. In this case, as shown in FIG. 6, movement of the incidence plane 8a of the micro-fly's eye lens 8 along the optical axis AX from the original pupil conjugated position indicated by the arrow F6 in the drawing to the position indicated by the arrow F7 disrupts the image side telecentricity of the projection optical system PL and particularly adjusts (corrects) the magnification telecentricity component (telecentricity disruption component that increases the inclination of the principal ray as the image height becomes larger on the wafer W).

When moving the incidence surface 8a of the micro-fly's eye lens 8 along the optical axis direction from the original position F6, in the same manner as when in the spaced state of the conical axicon system 6 shown in FIG. 3, the conjugated relationship of the pupil position of the composite system of the conical axicon system 6 and the afocal optical system 4 with the incidence surface 8a of the micro-fly's eye lens 8 is no longer established. Further, an annular light intensity distribution having a profile with a distorted periphery as shown at the right end in FIG. 3 is formed at the incidence surface (illumination pupil plane) 8a of the micro-fly's eye lens 8.

Figure 6:
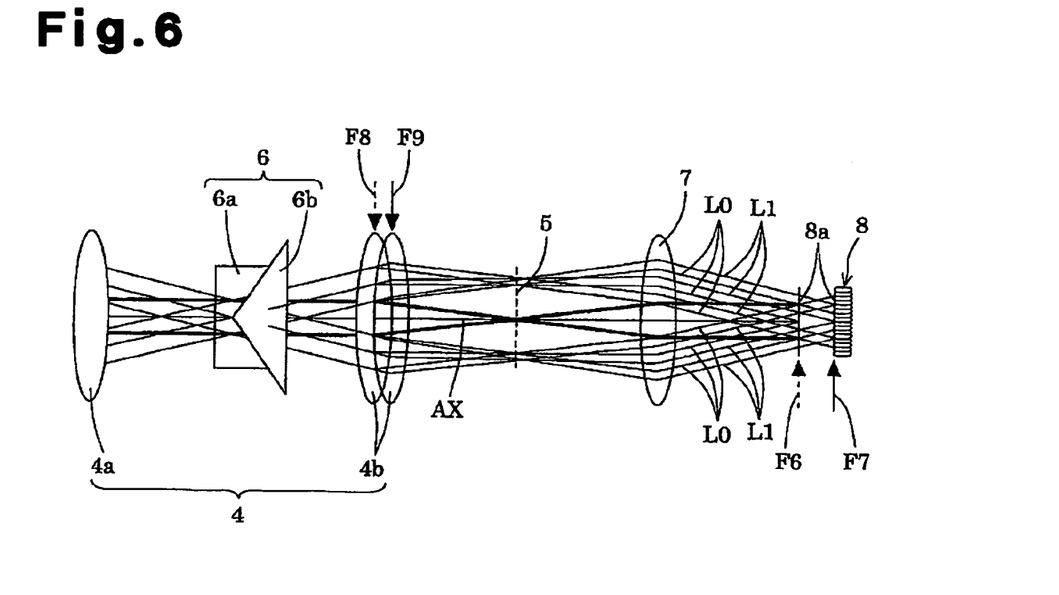
FIG. 6 is a diagram showing a state for shaping the profile of the light intensity distribution formed at the illumination pupil plane by moving the rear lens group in the afocal optical system in accordance with the movement of a micro-fly's eye lens.

In this embodiment, as shown in FIG. 6, when adjusting the disruption of the image side telecentricity of the projection optical system PL by moving the incidence surface 8a of the micro-fly's eye lens 8 from the original pupil conjugated position F6, the rear lens group 4b is integrally moved along the optical axis AX in accordance with movement of the micro-fly's eye lens 8 in the optical axis direction. Specifically, the rear lens group 4b is moved along the optical axis AX from the original position indicated by the arrow F8 in the drawing to the position indicated by the arrow F9 so as to maintain the conjugated relationship of the pupil position of the composite system of the conical axicon system 6 and the afocal optical system 4 with the incidence surface 8a of the micro-fly's eye lens 8.

In this manner, even in a state in which the micro-fly's eye lens 8 (adjustment system, adjustment optical system) is moved in the optical axis direction to adjust disruption of the image side telecentricity of the projection optical system PL (or adjust inclination of the principal ray relative to the optical axis with respect to the substrate), the profile of the light intensity distribution at the illumination pupil plane 8a is shaped by the movement in the optical axis direction of the rear lens group 4b. Further, the annular light intensity distribution having the substantially desired profile that is close to the top-hat shape can be formed on the pupil plane of the projection optical system PL. As a result, the light intensity distribution is not partially shielded by the aperture AS of the aperture stop arranged at the pupil plane of the projection optical system PL. Thus, stray light is not generated, and the imaging capability is not affected in an undesirable manner. In FIG. 6, reference numeral L0 indicates the light beams corresponding to the rear lens group 4b at the original position F8, and reference numeral L1 indicates the light beams corresponding to the rear lens group 4b moved to the position F9.

In the above description, the profile of the light intensity distribution at the illumination pupil plane 8a is shaped by integrally moving the rear lens group 4b of the afocal optical system 4 along the optical axis AX. However, the present invention is not limited in such a manner, and the profile of the light intensity distribution at the illumination pupil plane 8a can be shaped by moving along the optical axis AX one or more lenses in the rear lens group 4b or one or more appropriate movable lenses that are not included in the rear lens group 4b. Specifically, the profile of the light intensity distribution at the illumination pupil plane 8a can be shaped by moving one or more movable lenses arranged in the optical path between the conical axicon system 6 and the micro-fly's eye lens 8, that is, one or more movable lenses in the zoom lens 7 serving as the variable magnification optical system.

In the above description, to facilitate the understanding, disruption of the image side telecentricity of the projection optical system PL is adjusted by moving the micro-fly's eye lens 8 in the contact state of the conical axicon system 6 as shown in FIG. 6. In this manner, when the conical axicon system 6 does not operate or when the conical axicon system 6 is not included in the afocal optical system 4, the movement of the rear lens group 4b (generally one or more movable lenses) is performed in accordance with the movement of the micro-fly's eye lens 8 in the optical axis direction. However, when adjusting disruption of the image side telecentricity for the projection optical system PL while operating the conical axicon system 6 and changing the outer shape of the light intensity distribution on the illumination pupil plane 8a by, for example, moving the micro-fly's eye lens 8, the movement of one or more movable lenses is performed in accordance with a change in the interval in the optical axis direction between the first prism member 6a and the second prism member 6b and movement in the optical axis direction of the micro-fly's eye lens 8.

Further, in the above description, disruption of the image side telecentricity for the projection optical system PL is adjusted by moving the micro-fly's eye lens 8. However, the present invention is not limited in such a manner. Disruption of the image side telecentricity for the projection optical system PL can be adjusted by moving an optical member other than the micro-fly's eye lens 8, for example, one or more adjustment lenses along the optical axis AX. Specifically, distortion of the image side telecentricity of the projection optical system PL can be adjusted by moving one or more adjustment lenses arranged on the optical path between the micro-fly's eye lens 8 and the mask M along the optical axis AX. In this case, the profile of the light intensity distribution at the illumination pupil plane 8a can be shaped by moving one or more movable lenses arranged closer to the light source side than the micro-fly's eye lens 8 along the optical axis AX in accordance with the movement of the one or more adjustment lenses.

In the above description, the annular light intensity distribution is formed at the illumination pupil plane 8a even in the contact state and the spaced state of the conical axicon system 6 using the annular illumination diffractive optical element 3. However, the present invention is not limited in such a manner. For example, instead of the annular illumination diffractive optical element 3, a circular illumination diffractive optical element (not shown) may be set in an illumination optical path to perform conventional circular illumination when the conical axicon system 6 is in a contact state, and annular illumination may be performed when the conical axicon system 6 is in the spaced state. The circular illumination diffractive optical element functions to form a circular light intensity distribution in a far field upon entry of parallel light having a rectangular cross-section.

In the above description, the present invention is applied to annular illumination. However, the present invention is not limited in such a manner, and the present invention may be applied in the same manner to quadrupole illumination, dipole illumination, and the like. In the case of the quadrupole illumination, the diffractive optical element for quadrupole illumination (or diffractive optical element for circular illumination) is set in the illumination optical path in place of the diffractive optical element 3 for annular illumination, and a pyramidal axicon system is set on or near the pupil plane of the afocal optical system 4 in place of the conical axicon system 6 (or in addition to the conical axicon system 6).

In the case of dipole illumination, the diffractive optical element for dipole illumination (or diffractive optical element for circular illumination) is set in the illumination optical path in place of the diffractive optical element 3 for annular illumination, and a V-shaped groove axicon system is set on or near the pupil plane of the afocal optical system 4 in place of the conical axicon system 6 (or in addition to the conical axicon system 6). The diffractive optical element of the quadrupole illumination (dipole illumination) functions to form a quadrupole (dipole) light intensity distribution in the far field upon entry of the parallel light beam having a rectangular cross-section. The pyramidal axicon system has a refraction surface shaped in correspondence with the side surface of a pyramidal body of which the center is the optical axis, and the V-shaped groove axicon system has a refraction surface with a V-shaped cross-sectional shape substantially symmetric with respect to a predetermined axis line passing through the optical axis. Reference can be made to Japanese Laid-Open Patent Publication No. 2002-231619 (and corresponding U.S. Patent Publication No. 2004/0263817A1) and the like for the structure and operation of the conical axicon system and the V-shaped groove axicon system. The teachings of which are hereby incorporated by reference.

In the exposure apparatus of the above-described embodiment, a micro-device (e.g., semiconductor device, imaging device, liquid crystal display device, thin-film magnetic head, and the like) may be manufactured by illuminating a mask (reticle) with an illumination optical apparatus (illumination process) and exposing a transfer pattern formed on the mask onto a photosensitive substrate with a projection optical system (exposure process). One example of the procedures for obtaining a semiconductor device serving as a micro-device by forming a predetermined circuit pattern on a wafer or the like, serving as the photosensitive substrate, with the exposure apparatus of the above-described embodiment will now be described with reference to the flowchart of FIG. 10.

Figure 7:
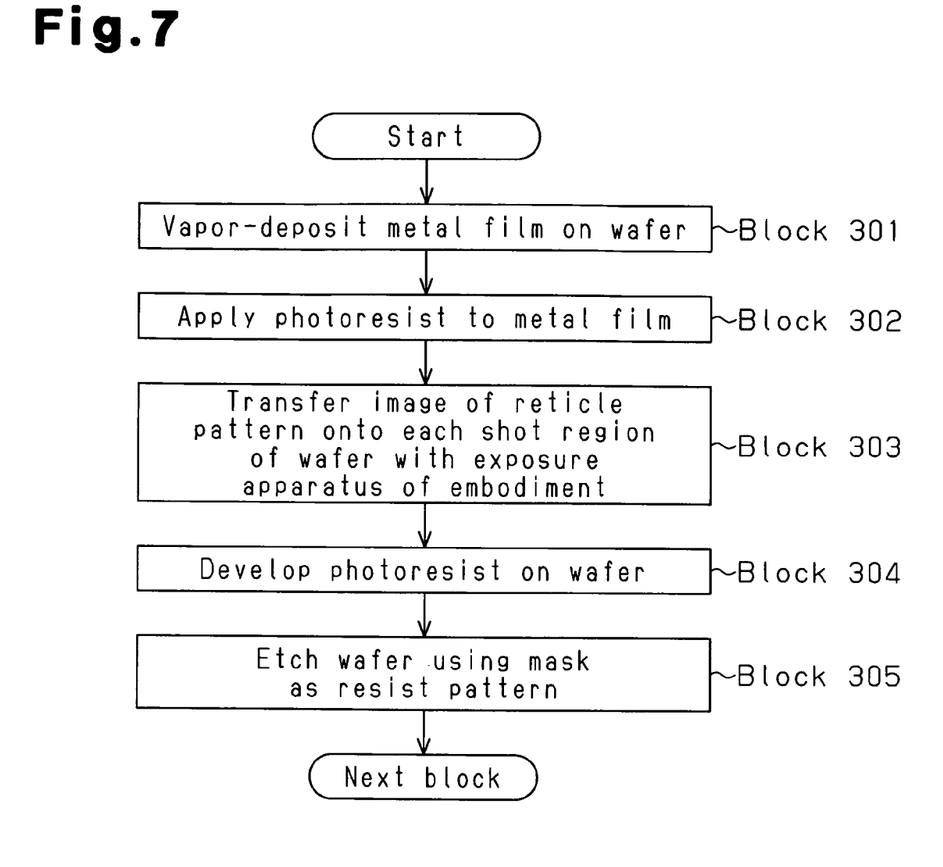
FIG. 7 is a flowchart showing the procedures for obtaining a semiconductor device serving as a micro-device.

First, in block 301 of FIG. 7, a metal film is vapor deposited on a single lot of wafers. Next, in block 302, photoresist is applied to the metal film on the single lot of wafers. Then, in block 303, the image of a pattern on a mask is sequentially exposed and transferred to each shot region in the single lot of wafers with the projection optical system of the exposure apparatus of the above-described embodiment. After the photoresist on the single lot of wafers is developed in block 304, etching is carried out on the single lot of wafers using a resist pattern as the mask in block 305 so that a circuit pattern corresponding to the pattern on the mask is formed in each shot region of each wafer. The circuit pattern or the like of an upper layer is then formed to manufacture a device such as a semiconductor device. The above-described semiconductor device manufacturing method obtains semiconductor devices having extremely fine circuit patterns with satisfactory throughput.

Figure 8:
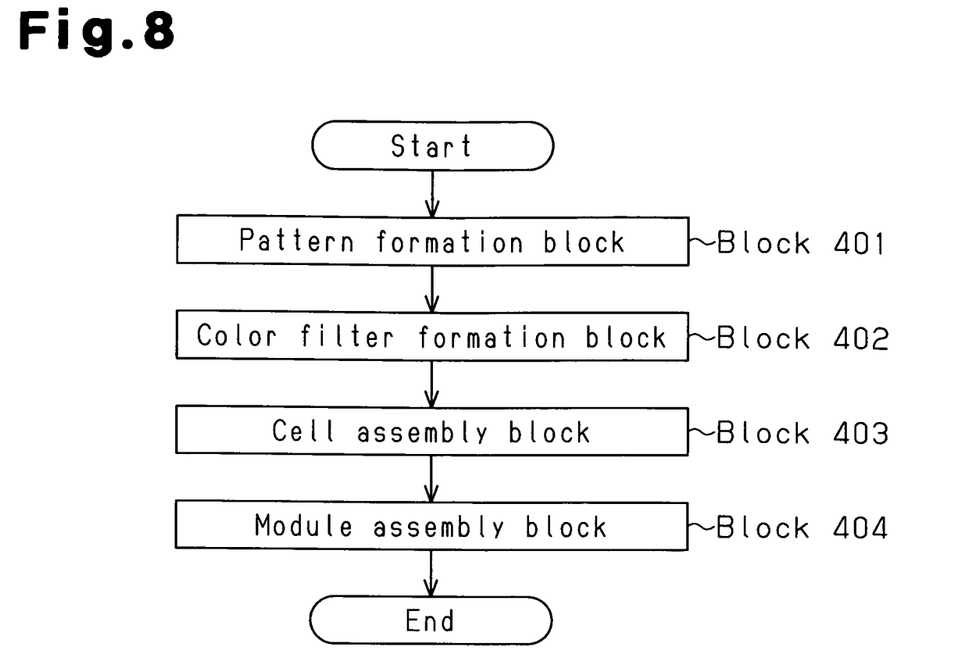
FIG. 8 is a flowchart showing the procedures for obtaining a liquid crystal display device serving as a micro-device.

In the exposure apparatus of the above-described embodiment, a liquid crystal display device serving as a micro-device can be obtained by forming a predetermined pattern (circuit pattern, electrode pattern etc.) on a plate (glass substrate). One example of the procedures taken in this case will now be described with reference to the flowchart of FIG. 8. In FIG. 8, a so-called photolithography process of transferring and exposing a pattern of a mask onto a photosensitive substrate (glass substrate to which resist and the like is applied) using the exposure apparatus of the present embodiment is performed in a pattern formation block 401. A predetermined pattern including many electrodes is formed on the photosensitive substrate through the photolithography block. The exposed substrate then undergoes the processes including a development block, an etching block, and a resist removal block to form a predetermined pattern on the substrate. Then, the next color filter formation block 402 is performed.

In the color filter formation block 402, a color filter is formed in which many sets of three dots corresponding to R (Red), G (Green), and B (Blue) is arranged in a matrix form in which a plurality of sets of three stripe filters of R, G, and B are arranged extending in a horizontal scanning line direction. After the color filter formation block 402, a cell assembling block 403 is performed. In the cell assembling block 403, a liquid crystal panel (liquid crystal cell) is assembled using the substrate having the predetermined pattern obtained in the pattern formation block 401 and the color filter obtained in the color filter formation block 402.

In the cell assembling block 403, for example, a liquid crystal panel (liquid crystal cell) is manufactured by injecting liquid crystal between the substrate having the predetermined pattern obtained in the pattern formation block 401 and the color filter obtained in the color filter formation block 402. Then, in a module assembling block 404, components such as electric circuits and a backlight for enabling a display operation of the assembled liquid crystal panel (liquid crystal cell) are mounted to complete a liquid crystal display device. In the above-described manufacturing method for a liquid crystal display device, liquid crystal display devices having extremely fine circuit patterns are obtained with satisfactory throughput.

In the above-described embodiment, the present invention is applied to an illumination optical apparatus for illuminating a mask with an exposure apparatus. However, the present invention is not limited in such a manner and may be applied to a general illumination optical apparatus that illuminates an irradiated plane other than a mask.

In the illumination optical apparatus of the embodiment of the present invention, for example, the profile (cross-sectional shape) of light intensity distribution at an illumination pupil plane is shaped by changing an interval along an optical axis between the pair of prisms in an axicon system to change the outer shape of the light intensity distribution at the illumination pupil plane and by moving one or more movable lenses in the direction of the optical axis in accordance with the change in the interval along the optical axis between the pair of prisms.

Therefore, in the illumination optical apparatus of embodiment of the present invention, the substantially desired profile is maintained even when the outer shape of the light intensity distribution at the illumination pupil plane is changed by an axicon system. In the exposure apparatus of the embodiment of the present invention, satisfactory exposure can be performed under proper illumination conditions and a satisfactory device can be manufactured using an illumination optical apparatus capable of changing the outer shape of the light intensity distribution at the illumination pupil plane while maintaining the substantially desired profile.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. An illumination optical apparatus for use in an exposure apparatus for exposing a predetermined pattern onto a substrate with a projection optical system, the illumination optical apparatus illuminating the predetermined pattern using a light from a light source, the apparatus comprising:
    a first optical system located in an illumination path of the illumination optical apparatus, the first optical system distributing the light from the light source in a predetermined form at a position of a far field of the first optical system;
    a correction member having a second optical system, wherein the second optical system focuses the light, which is distributed at the position of the far field, at a first plane in the illumination path; and
    an optical system having an optical integrator, wherein the optical integrator forms a planar light source using the light from the second optical system,
    wherein the second optical system includes one or more movable lenses which are movable in the optical axis direction, and wherein the second optical system changes a position of the first plane in the optical axis direction by moving the one or more movable lenses.

2. The illumination optical apparatus according to claim 1, wherein the second optical system includes one or more movable lenses which are movable in the optical axis direction.

3. The illumination optical apparatus according to claim 2, wherein the first optical system includes first and second prisms, with an interval therebetween being relatively variable.

4. The illumination optical apparatus according to claim 3, wherein the optical integrator includes an optical integrator movable in the optical axis direction.

5. An exposure apparatus comprising:
the illumination optical apparatus according to claim 1 which illuminates and exposes a predetermined pattern onto a photosensitive substrate.

6. A device manufacturing method comprising:
exposing the predetermined pattern onto the photosensitive substrate using the exposure apparatus according to claim 5; and
developing the photosensitive substrate onto which the pattern has been transferred;
forming a mask layer shaped in correspondence with the pattern on the photosensitive substrate; and
processing the surface of the photosensitive substrate through the mask layer.

7. An exposure apparatus according to claim 1 comprising:
the illumination optical apparatus, wherein the illumination optical apparatus illuminates and exposes a predetermined pattern onto a photosensitive substrate.

8. A device manufacturing method for an illumination optical apparatus for use in an exposure apparatus for exposing a predetermined pattern onto a substrate with a projection optical system, the illumination optical apparatus illuminating the predetermined pattern using a light from a light source,
wherein the illumination optical apparatus comprises:
a first optical system located in an illumination path of the illumination optical apparatus, the first optical system distributing the light from the light source in a predetermined form at a position of a far field of the first optical system;
a second optical system focuses the light, which is distributed at the position of the far field, at a first plane in the illumination path; and
an optical integrator forms a planar light source using the light from the second optical system,
wherein the second optical system changes an interval along an optical axis direction of the illumination optical apparatus between an incidence plane of the optical integrator and the first plane,
wherein the second optical system includes one or more movable lenses which are movable in the optical axis direction, and wherein the second optical system changes a position of the first plane in the optical axis direction by moving the one or more movable lenses, and
wherein the exposure apparatus comprises:
the illumination optical apparatus, wherein the illumination optical apparatus illuminates and exposes a predetermined pattern onto a photosensitive substrate;
the method comprising:
exposing the predetermined pattern onto the photosensitive substrate using an exposure apparatus; and
developing the photosensitive substrate onto which the pattern has been transferred.

* * * * *